US012134263B2

(12) United States Patent
Harwell et al.

(10) Patent No.: US 12,134,263 B2
(45) Date of Patent: *Nov. 5, 2024

(54) PLATEN AND RELEASE FLUID CONTROL SYSTEM FOR STENCIL CREATION

(71) Applicant: DuralChrome AG, Niederrohrdorf (CH)

(72) Inventors: John Cecil Harwell, Pinea de Mar (ES); Shlomo Hermon, Winterhur (CH); René Bär, Niederrohrdorf (CH)

(73) Assignee: DualChrome AG, Niederrohrdorf (CH)

( * ) Notice: Subject to any disclaimer, the term of this patent is extended or adjusted under 35 U.S.C. 154(b) by 0 days.

This patent is subject to a terminal disclaimer.

(21) Appl. No.: 18/021,035

(22) PCT Filed: Aug. 14, 2020

(86) PCT No.: PCT/EP2020/072899
§ 371 (c)(1),
(2) Date: Feb. 13, 2023

(87) PCT Pub. No.: WO2022/033702
PCT Pub. Date: Feb. 17, 2022

(65) Prior Publication Data
US 2024/0025168 A1 Jan. 25, 2024

(51) Int. Cl.
*B41F 15/38* (2006.01)

(52) U.S. Cl.
CPC .................................. *B41F 15/38* (2013.01)

(58) Field of Classification Search
CPC .......... B41F 15/08; B41F 15/34; B41F 15/36; B41C 1/14; B41C 1/147; H05K 3/1225
See application file for complete search history.

(56) References Cited

U.S. PATENT DOCUMENTS

| 3,384,931 | A | * | 5/1968 | Resen | H01C 17/065 257/E21.534 |
| 5,819,653 | A | * | 10/1998 | McCue | B41C 1/147 101/128.21 |
| 11,376,837 | B2 | * | 7/2022 | Harwell | B33Y 30/00 |
| 11,926,143 | B2 | * | 3/2024 | Harwell | B41F 15/38 |
| 2019/0084333 | A1 | * | 3/2019 | Ohnishi | B41C 1/147 |

* cited by examiner

*Primary Examiner* — David H Banh
(74) *Attorney, Agent, or Firm* — Workman Nydegger (57) ABSTRACT

A direct to mesh (DtM) screen printer for creating a screen stencil is provided. The DtM screen printer includes a fixture to hold a frame, which holds a pre-stretched mesh in place during application of a jettable emulsion, a platen having a cavity and an array of holes in a top surface of the platen and is located against one side of the pre-stretched mesh, and a printer carriage supporting a print head for printing the jettable emulsion on a side of the pre-stretched mesh opposite the platen.

17 Claims, 9 Drawing Sheets

PLATEN AND RELEASE FLUID CONTROL SYSTEM FOR STENCIL CREATION

BACKGROUND

Screen printing is a printing technique whereby a mesh is used to transfer ink onto a substrate, except in areas made impermeable to the ink by a screen printing stencil, also called a blocking stencil. A blade or squeegee is moved across the screen to fill the open mesh apertures with ink, and a reverse stroke then causes the screen to touch the substrate momentarily along a line of contact. This causes the ink to wet the substrate and be pulled out of the mesh apertures as the screen springs back after the blade has passed.

The creation of a screen printing stencil is a tedious, labor-intensive job. It is one that requires a number of process steps, chemical products, lots of water, and is largely manual. It is the least automated part of the current screen printing business.

BRIEF DESCRIPTION OF THE DRAWINGS

Features of examples of the present disclosure will become apparent by reference to the following detailed description and drawings, in which like reference numerals correspond to similar, though perhaps not identical, components. For the sake of brevity, reference numerals or features having a previously described function may or may not be described in connection with other drawings in which they appear.

DETAILED DESCRIPTION

There are several examples of previous solutions for directly coating a mesh to form a stencil for screen printing. These are now described.

Mesh Preparation and Coating:

Direct application of emulsion: this is done either with a machine or by hand. Both sides of the screen must be coated with the emulsion to ensure proper coverage. The machine or automated version is strictly a machine replacing a human. The machine is much more accurate at applying precise amounts of the emulsion and getting even coverage. The machine generally has less waste.

Capillary films: These are films that are pre-coated with an emulsion. The mesh is oversaturated with water and the film (emulsion side down) is placed against the supersaturated mesh. The capillary action draws the emulsion into the mesh. This gives a more precise coating of the emulsion, both in thickness and in cover. Once the emulsion has diffused into the mesh, the film is peeled off.

Once the screen mesh is emulsified it must be dried. Once dry, it is ready for the image transfer or making of the stencil. As the emulsion dries, it contracts and conforms to the mesh causing a rough, uneven surface. (This rough surface causes an accelerated aging of the squeegee during the printing process.)

Most emulsions today are activated by ultra-violet (UV) radiation (i.e., UV-activated) but may also be visible-light activated. Once coated, the stencils must be protected from any exposure to light (even normal visible light has enough UV to start the curing process). Hereinafter, it is assumed that the emulsion is UV-activated/cured.

Film Positive Ink: A totally black, UV absorbent layer is printed onto a clear sheet of plastic. The printing is done normally by laser or inkjet printers with special film positive inks (film positive ink means a high opacity black ink that completely blocks all visible and UV light). The film is then attached to the pre-coated mesh and exposed to UV light. The attachment is usually by a removable tape (such as masking tape). Once exposed, the film is removed and the uncured emulsion is washed off.

However, this approach is very labor intensive at all stages, and it is not possible to automate many steps. In addition, it is prone to error, such as during mounting the film, using the correct film, adjusting the final stencil before print. Lots of chemicals and washing, as well as lots of consumables (inks, films), are required.

Thermal Screen: In this method, the mesh is pre-coated with a thermally-activated emulsion. Typically, the mesh (without a frame) is put into a thermal printer, where the emulsion is directly cured/activated. Once completed, the un-exposed emulsion is washed off, the stencil is mounted on a frame, and printed.

However, this approach suffers from Limited mesh counts. Also, the emulsions are typically not as robust. The pre-treated mesh is expensive. The stencil alignment is more intensive. Finally, the stencil can be damaged while it is being mounted.

Computer to Screen (CtS):

CtS—Printed: In this method, the coated mesh is directly printed onto the emulsified screen with a high-opacity black ink. This is similar to Film Positive Inks without the film. All of the processes are the same.

However, these machines require a high-opacity ink, which is more expensive than regular inkjet inks.

CtS—Wax: This method is a close relative of CtS—Printed, but uses wax to block the UV light. All else is the same.

However, due to the use of melted wax, these machines can be temperamental. Further, they require that the wax be heated to apply it to the mesh.

CtS—Direct Exposure: This technology directly exposes the emulsion using a UV laser.

However, the machines used in this technology are typically very expensive. Further, the process does not work as well on coarse grade mesh. Finally, UV lasers are still very expensive when they need replacing.

Each of the above methods require some post-processing/follow-up. Except for Thermal Activated and CtS Direct Exposure, all stencils must be exposed after the image blocking is applied (either films or CtS Printed and Wax). This process takes, for example, at least about 1 to 2 minutes per screen with an intense developer.

All screens must have the excess emulsion washed off. Care must be taken so that the emulsion does not get into the drainage system. Screens must be thoroughly dried after washing.

For the Film and Thermal Activated methods, the finished stencil must be fine adjusted when placed on the carousel to ensure proper registration.

Current Disclosure:

It is clear from the foregoing description of the current technology that a simpler approach that uses fewer chemicals and less water would be desirable.

A Direct to Mesh (DtM) approach is used to form a stencil by directly applying and activating/exposing an emulsion onto a screen using inkjet technology. In particular, and in accordance with the teachings herein, a DtM screen printer includes:
- a frame to hold a pre-stretched mesh in place during application of a jettable emulsion;
- a fixture to hold the frame;
- a platen having a cavity and perforated top surface, the cavity holds a release fluid dispensed through holes in the top surface and form a release fluid layer against one side of the pre-stretched mesh;
- a release fluid control system for dispensing the release fluid into the cavity of the platen and form the release fluid layer; and
- a printer carriage supporting a print head for printing the jettable emulsion on a surface of the pre-stretched mesh opposite the platen.

As disclosed and claimed herein and in accordance with the teachings herein, the platen includes a perforated top surface and is used to introduce and maintain the level of the release fluid below and in contact with the mesh. An array of holes in the perforated top surface ensures that the mesh is evenly coated by the release fluid. A release fluid control system controls penetration of the release fluid into the mesh and may be used to maintain an essentially constant release fluid moisture level of the mesh throughout printing of the emulsion onto the mesh.

Figure 1:
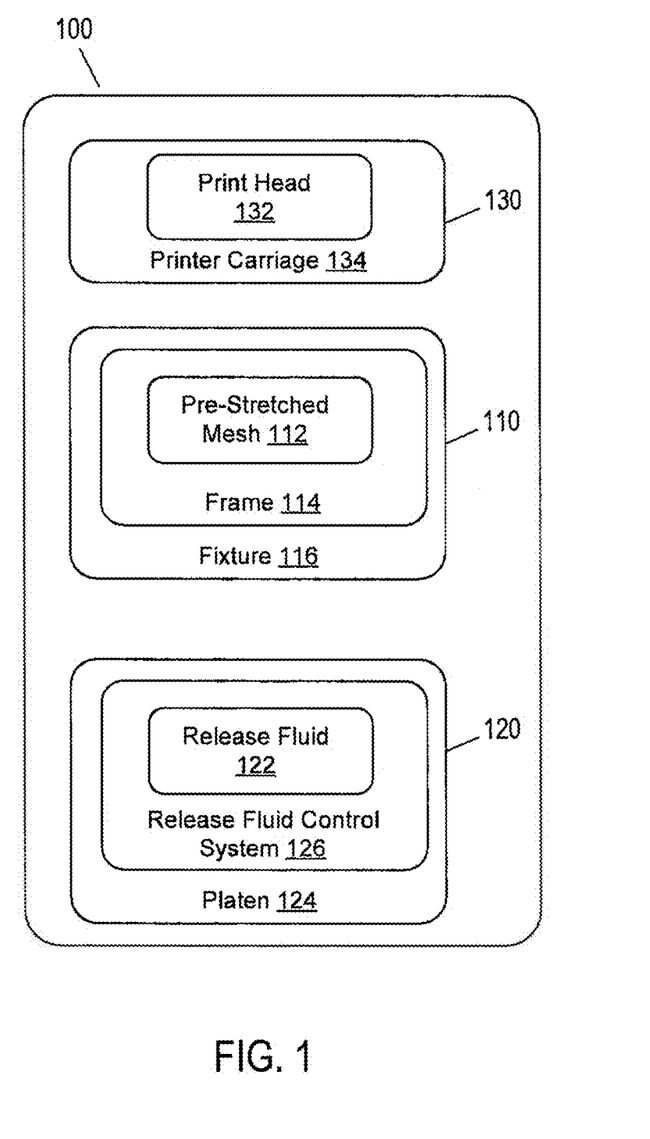
FIG. 1 illustrates a direct to mesh screen printer, according to an example of the present disclosure.

FIG. 1 depicts a block diagram of the direct to mesh (DtM) printer 100. The DtM printer 100 includes a mesh support system 110 that includes the pre-stretched mesh 112 held in place by the frame 114. The frame 114 is in turn held by the fixture 116. The fixture 116 securely and firmly holds the frame 114 with the pre-stretched mesh 112 in place during the application of the jettable emulsion.

As used herein, the mesh 112 is made of connected strands of textiles, fiber, metal, or other flexible/ductile materials, here, woven in a crisscross pattern. The material comprising the mesh may be any of a number of textiles including silks; polyesters; metals, such as stainless steel; plastics, such as polypropylene, polyethylene, nylon, polyvinyl chloride (PVC) or polytetrafluoroethylene (PTFE); or fiberglass. The diameter of the strands may be any diameter common in screen printing, and the mesh size may also be any size common in screen printing. Coarser mesh is typically woven with larger diameter (gauge) strands, which requires a thicker application of the emulsion.

The DtM printer 100 further includes a platen support system 120, including a release fluid 122 held against the underside of the pre-stretched mesh 112 by a platen 124. The platen 124 provides a smooth flat surface for the release fluid 122 to be held firmly against the bottom of the pre-stretched mesh 112. The platen 124 includes a surface that is perforate with holes, is smooth, and is resistant to dents and cracks. The platen includes a cavity for storing the release fluid that is force through the holes to coat the surface of the platen located beneath the mesh. The platen 124 may also act to dissipate energy from a UV curing source 208 (not shown in FIG. 1 but shown in FIG. 2D).

The release fluid 122 may be applied onto the mesh 112 once the mesh is in position over the platen prior to the application of the jettable emulsion. For example, a release fluid control system 126 controls the level of the release fluid 122 injected from the cavity onto the surface of the platen 124. In particular, the release fluid control system 126 controls the level of the release fluid disposed on the surface of the platen 124 such that the meniscus of the release fluid and the capillary action of the release fluid enable the emulsion to wrap around the threads in the mesh.

The release fluid 122 inhibits dot-gain, which is the effect of a printed fluid spreading into a print medium, by not reacting with the curing emulsion. Dot-gain need only be inhibited for a short period, as the curing occurs very quickly after the emulsion fluid is jetted.

Finally, the DtM printer 100 includes an inkjet printer 130 that includes a print head 132 mounted on a printer carriage 134. The print head 132 prints the jettable emulsion on the side of the pre-stretched mesh 112 opposite to that of the platen 124. The printer carriage 134 is a high-precision printer carriage, accurate in both the X and Y Cartesian directions to support accurate droplet placement over one or more passes while building up the jettable emulsion. Indeed, the emulsion can be "built up" to accommodate a wide range of mesh gauges, from very fine to super coarse. The layering can be used to maintain high resolution as it builds up the emulsion.

The print head 132 may be an inkjet print head, such as thermal inkjet, piezoelectric inkjet, drop-on-demand inkjet, or other suitable jetting printhead capable of jetting fluids, including the jettable emulsion disclosed herein.

The screen mesh 112, which may be of any type, is stretched onto the frame 114. The frame 114 is put into the inkjet printer 130 with the release fluid 122 which has been dispensed on a surface of the platen 124 below the mesh 112. The jettable emulsion is then applied by the inkjet printer 130 to the masking areas and substantially simultaneously exposed with high intensity UV lamps or other suitable UV source, such as UV-light emitting diodes (LEDs). The wavelength of the UV lamp (or LED) may be tuned to the reaction range of the jettable emulsion for optimal performance. For the jettable emulsion disclosed herein, the emulsion reacts at a wavelength of 395 nanometers (nm). Other jettable emulsions may have other reaction wavelengths, including lower than 395 nm. For coarse mesh, the application may be a multi-pass operation in order to build up the necessary emulsion thickness. By "coarse mesh" is meant mesh having a loose weave, and thus having larger gaps between the strands than a fine mesh screen. Mesh counts are given as either tpi (threads per inch) or T (threads per centimeter). For example, 335 tpi (130 T) mesh count is considered to be fine mesh, while 110 tpi (43 T) mesh count is considered to be a coarse mesh, where mesh count is the number of thread crossings per square inch. 110 tpi (43 T) is most commonly used for general textile printing.

The Direct to Mesh process disclosed herein is made possible with the recent development of low viscosity jettable emulsions. By "low viscosity" is meant a range from about 4 centipoises (cP) to about 15 cP (about 4 millipascal second to about 15 millipascal second). These jettable emulsions are used to create an embossing effect with UV printers onto a wide variety of materials. These new jettable emulsions are also more elastic, so they can be used more readily as a replacement for previous emulsions. Any color can be used for the jettable emulsion, including transparent or clear, although light cyan or light magenta may be used to provide a slight contrast in order to verify the stencil.

An example of a jettable emulsion that may be suitably employed in the process disclosed herein is a UV-activated acrylate monomer with elastomeric qualities after curing. The jettable emulsions are specialty embossing "varnish" polymers that quickly cure into both highly durable/resistant layers that quickly build up on the substrate. The cured polymer is also durable and flexible/elastic (if it were rigid, it would crack easily under use and render the stencil useless). VersaUV (Roland DG) technology is an example of a material that may be useful in the practice of the teachings herein.

The release fluid 122 provides a smooth, non-reactive printing surface under the mesh 112. It also serves to limit dot gain of the printed emulsion. Dot gain occurs when a jetted droplet (or dot) expands or spreads out before exposure to the UV light source (i.e., UV curing). This is particularly important when a half tone is employed, i.e., less than the entire space in the mesh is filled with emulsion. However, the dot-gain need only be inhibited for a short period as the UV curing occurs very quickly after the emulsion is jetted.

The release fluid 122 is a fluid that manages the dot gain and is non-reactive with the curing emulsion so that it does not lift or separate the emulsion from the mesh 112. The fluid for the release fluid 122 may be modified or tailored for the jettable emulsion by changing certain characteristics of the release fluid 122, including, but are not limited to, the addition of surfactants or wetting agents that change, the surface tension, ionic mix, polar or non-polar components, or whether the fluid is aqueous or non-aqueous.

The release fluid 122 may be water-based (e.g., distilled water), either water alone or with at least one emulsifier in a sufficient amount to prevent evaporation of the release fluid. Examples of emulsifiers, along with a class of emulsifiers known as surfactants, include, but are not limited to, polysorbates, glycerins, and glycols, such as butyl cellosolve. In some embodiments, the emulsifier(s) may be present in an amount of at least 3 vol % to 5 vol % to prevent evaporation of the release fluid 122. Further examples of the release fluid 122 include water-based varnishes, such as butyl acetate, xylene, xylol, dimethyl benzene, and combinations thereof.

In most preparations in the current art, the emulsion can be quite rough; this is often caused by conformance of the emulsion to the mesh during the drying process. This rough emulsion surface can wear away at the squeegee, requiring resurfacing or replacing of the squeegee blade. In the Direct to Mesh process, however, when the jettable emulsion is built up in the mesh, the release fluid 122 ensures encapsulation of the mesh strands see, for example, FIG. 5 and its associated discussion.

Since the emulsion applied to the mesh 112 is only in a blocking area, there is essentially little risk of over-shoot or over-exposure from reflection of the UV light into masked areas. This provides a much smoother, cleaner image. (These over-shoot and over-exposure areas can create spots or drops inside the image, especially around the edges. These are the "inverse" of pin holes.)

Figure 2A:
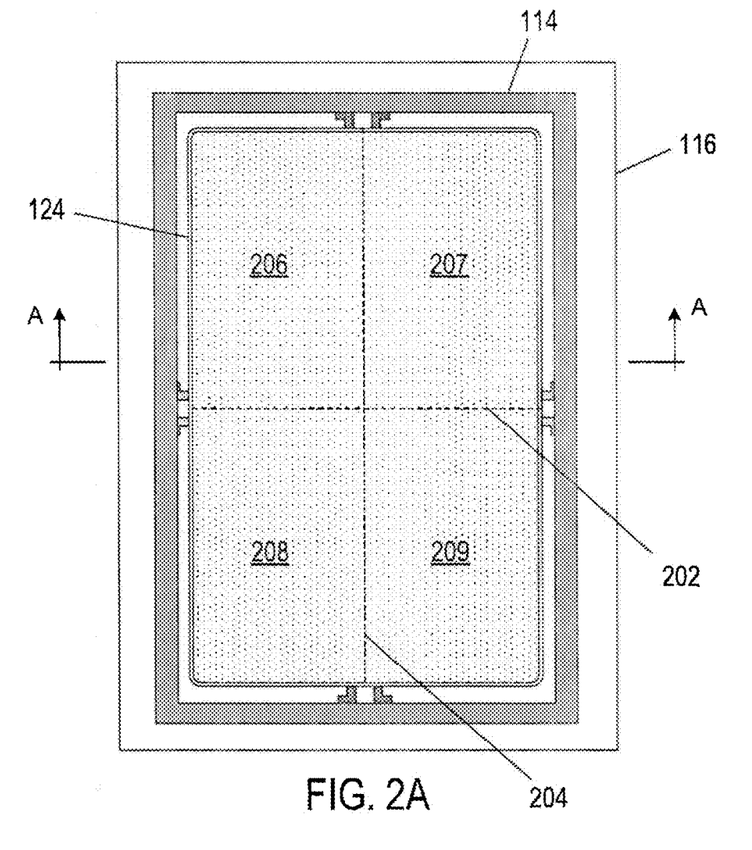
FIG. 2A illustrates top plan view of a platen, a frame, and a fixture.
Figure 2B:
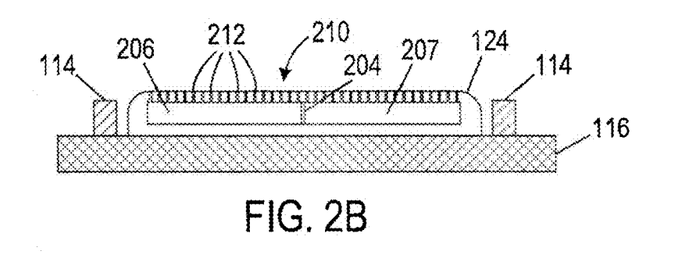
FIGS. 2B-2C illustrate cross-sectional views of the platen, frame, and fixture shown in FIG. 2A.
Figure 2C:
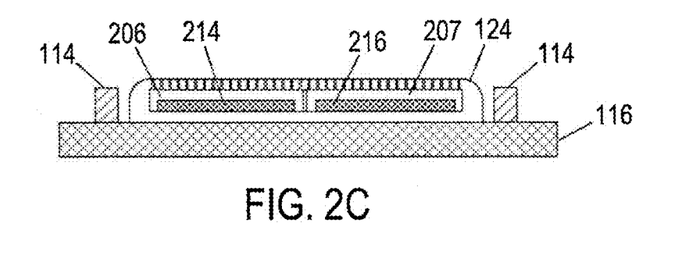
Figure 3:
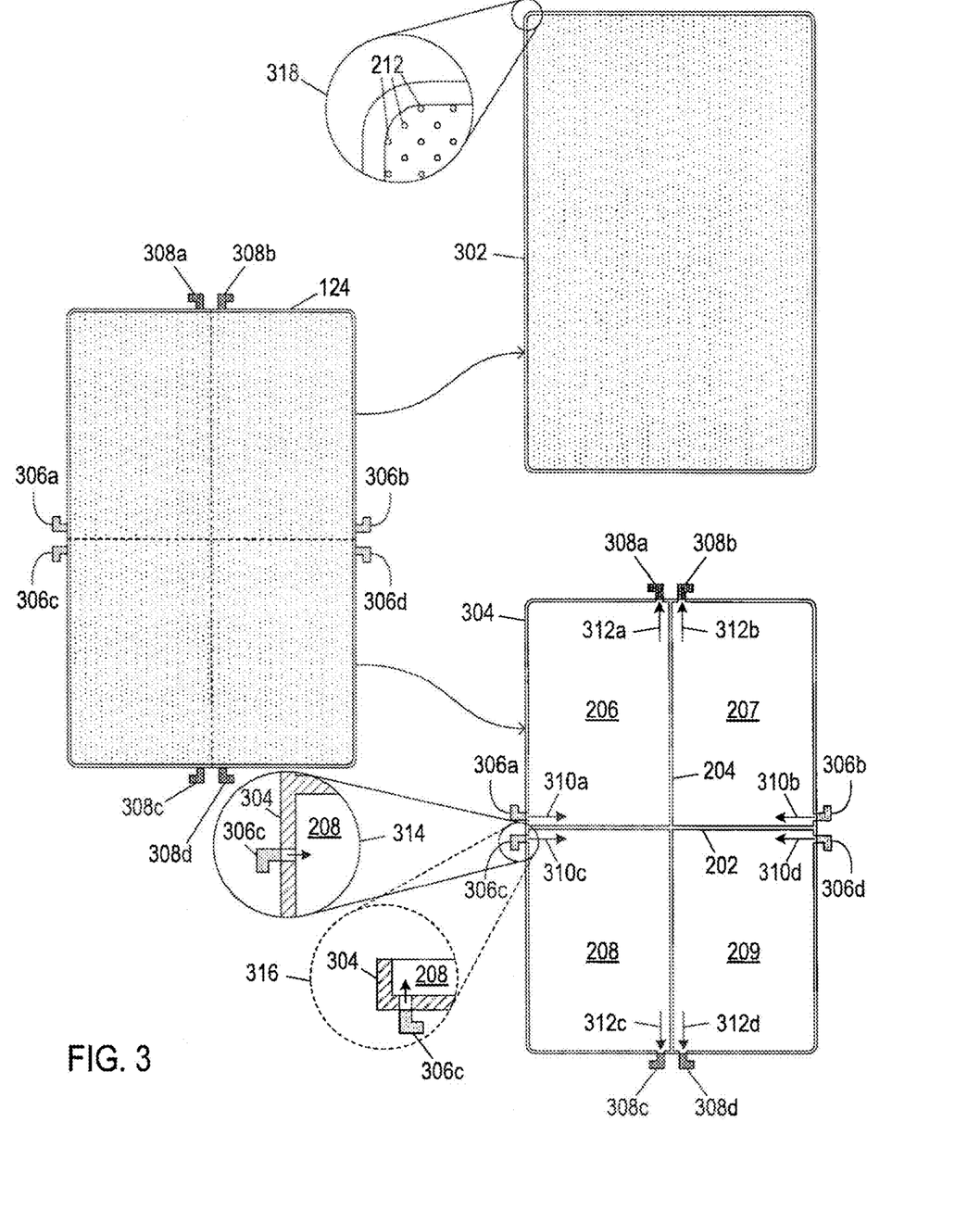
FIG. 3 shows a top plan view of platen and top and bottom plates of the platen.

Examples of platens are depicted in FIGS. 2A-3.

In FIG. 2A, a platen 124 is disposed on a fixture 116 and is surrounded by a frame 114. The fixture 114 may include clamps (not shown) that hold the frame 114 and the platen 124 in place during printing. Dashed lines 202 and 204 identify internal walls that separate four internal cavities 206-209 of the platen 124. In general, the walls, such as walls 202 and 204, are for controlling the flow of the release fluid inside of the platen 124. FIG. 2B shows a cross-sectional view of the platen 124, fixture 116, and frame 114 in the direction indicated by line A-A. The cross-sectional view reveals the cavities 206 and 207 separated by a wall 204. The cross-sectional view also shows that the top surface 210 of the platen 124 is perforated with holes 212 that lead to the cavities 206 and 207. Inserts may be added to the cavities to reduce the volumes of the cavities and aid in even distribution of the release fluid within each cavity. FIG. 2C shows a cross-sectional view of the platen 124, fixture 116, and frame 114 in the direction indicated by line A-A with inserts 214 and 216 located within the internal cavities 206 and 207, respectively. The inserts 214 and 216 may be made of foam, plastic, or wood. The inserts 214 and 216 reduce the release fluid volume.

Each cavity of the platen 124 has an input port and may have an output port. In certain implementations, the platen 124 may have only input ports and no outputs. Output ports may be included to control the flow of the release fluid and drain the release fluid when the platen 124 is no longer in use. When output ports are not included, the input ports are bi-directional in order to quickly lower the release fluid level. The platen 124 also comprises a top plate and a bottom plate.

In FIG. 3, the platen 124 is separated into a top plate 302 and a bottom plate 304. FIG. 3 shows the input ports 306a-306d located along the long sides of the bottom plate 304 and the output ports 308a-308d located along the short sides of the bottom plate 304. Directional arrows 310a-310d represent the inflow of the release fluid into the cavities 206-209 through the input ports 306a-306d. Directional arrows 312a-312d shows the outflow of the release fluid from the cavities 206-209 through the output ports 308a-308d. Magnified view 314 shows the input port 306c located in the long side of the bottom plate 304. In other implementations, the output ports may be located along the long sides of the bottom plate 304 and the input ports may be located along the short sides of the bottom plate 304. In still other implementations, the input ports 306a-306d and/or the output ports 308a-308d may be located in the underside of the bottom plate 304. Magnified view 316 shows an example of the input port 306c located underneath the cavity 208 of the bottom plate 304.

Input and output ports may be barbed fittings made of metal or plastic. For example, a straight, barbed fittings may be used for the input and output ports located along the long and short sides, or edges, of the bottom plate 304. Alternatively, barbed L-shaped fittings may be use for underside mounts.

It should be noted that the bottom plate 304 is not limited to four cavities. In other implementations, the bottom plate 304 may be includes a single cavity with multiple input and output ports (e.g., the walls 202 and 204 may be omitted). In other implementations, the bottom plate 304 may have two cavities, each cavity having at least one input port and at least one output port. In still other implementations, the bottom plate 204 may have six or more cavities, each cavity having at least one input port and at least one output port.

In FIG. 3, the top plate 302 is perforated with an array of holes that extend the thickness of the top plate. Magnified view 318 shows the top surface of the top plate 302. Holes 212 located in the top plate 302 allow for passage of the release fluid. The top plate 302 of the platen 124 provides a smooth, hard flat surface. When release fluid is dispensed into the cavities 206-209 and emerges through the array of holes 212, the distribution of holes 212 in the top plate 302 allows the release fluid to evenly coat the top surface of platen 124 and gently pushes mesh 112 taut to ensure an even, flat surface upon which to apply the emulsion. By "smooth" is meant that the surface of the plate 302 is a polished/glossy or frosted/matte as long as the surface is regular.

Example steps of the Direct to Mesh (DtM) process using the platen 124 are depicted in FIGS. 4A-4E, which are cross-sectional views of the DtM apparatus and the platen 124.

Figure 4A:
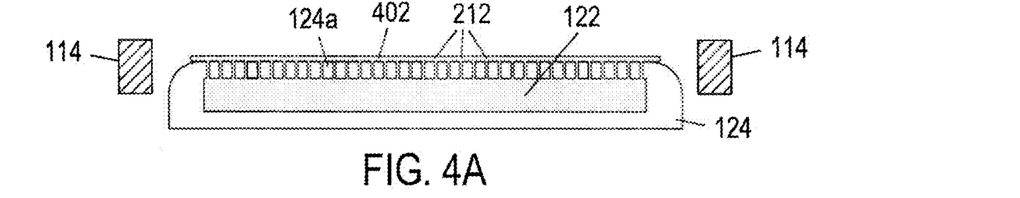
FIGS. 4A-4E depict, in cross-sectional view, elements of a process in screen printing, using a direct to mesh screen printer, according to an example of the present disclosure.

In FIG. 4A, frame 114 surrounds platen 124. The fixture 116 for supporting the frame 114 is omitted in this figure and in FIGS. 4B-4E. The frame fixture 116 is similar to what is currently used in the art. The release fluid 122 fills the cavities of the platen 124 and emerges through the holes 212 to form a release fluid layer 402 on a top surface 124a of the platen 124. Examples of release fluid control systems for dispensing the release fluid into the cavities of the platen 124 and onto the top surface 124a of the platen 124 are described below with reference to FIGS. 6 and 7.

Figure 4B:
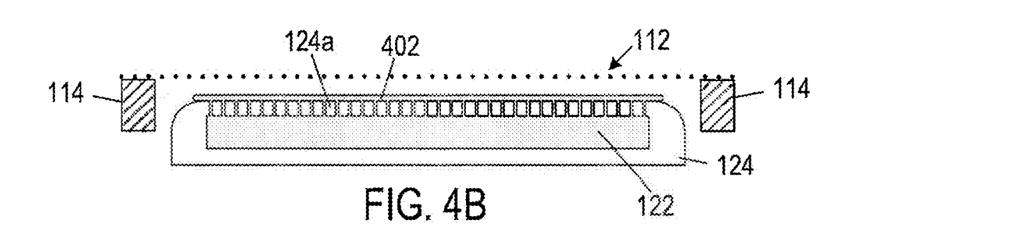

In FIG. 4B, mesh 112 is placed over the top of the frame 114. The platen 124 is located below the mesh 112 with a thin, even release fluid layer 402 of the release fluid 122 supported on surface 124a of platen 124. In some embodiments, the thickness of the release fluid 122 is about 20 micrometers (μm), but in any event less than the gauge of the mesh and is within ±0.5 μm planarity. The release fluid 122 backs up the mesh 112 to provide good coverage of the jettable emulsion, as it is applied. The release fluid 122 is formulated to avoid adherence of the jettable emulsion to the platen 124. The formulation of the release fluid 122 prevents the emulsion from bonding, reacting, or otherwise sticking to the platen 124. In some cases, the emulsion may react with the release fluid 122, but that interaction/reaction typically may not allow any adhesion to the platen 124. If the adhesion to the platen 124 is greater than the adhesion to the mesh 112, then the emulsion may de-bond/delaminate from the mesh. This may cause pin holes or bare patches. In the worst case, it could cause the mesh to be damaged or to tear.

Figure 4C:
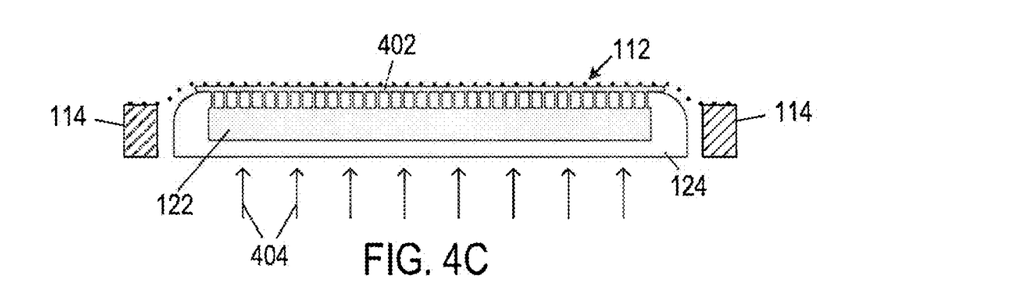

In FIG. 4C, the platen 124 with the release fluid layer 402 is moved up to the mesh 112, tightening the mesh 112 and pressing the underside of mesh 112 into the release fluid layer 402. This provides a smooth, tensioned, level surface to print the emulsion on. The movement of the platen 124 is indicated by arrows 404. Alternatively, frame 114 with the mesh 112 attached may be moved downward with the underside of the mesh 112 pressed into the release fluid layer 402.

Figure 4D:
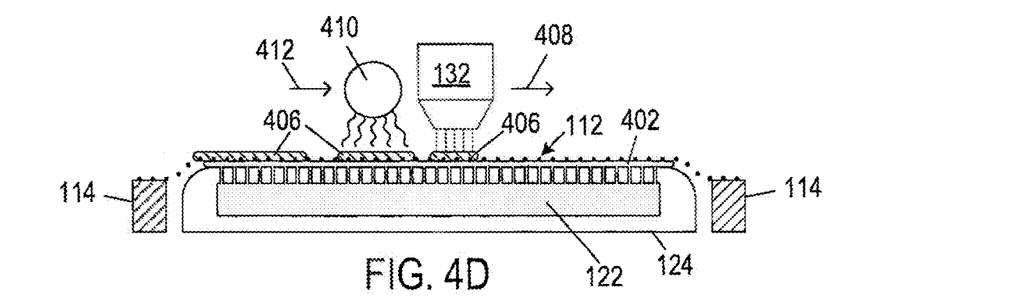

In FIG. 4D, the print head 132, which is translatable by the printer carriage 134 (not shown in FIG. 4D, but shown in FIG. 1) prints (i.e., deposits the emulsion) the blocking image, or stencil, 406 (seen in FIG. 4E) directly onto the mesh 112, where the blocking image is the reverse, or negative, of the actual image that is to be printed, or screened, onto a suitable print medium. The print head 132 moves laterally in the direction indicated by arrow 408 to form a screen stencil 406 on the mesh 112. The "ink" emitted from the print head is the UV-cured jettable emulsion, described above, which, in this example, is UV-cured essentially as it is applied by means of UV source 410. In an example, the UV source 410 moves laterally in the direction indicated by arrow 412. FIG. 4D depicts the print head 132 and UV source 410 moving across the mesh 112. However, the mesh support system, including the mesh 112 and frame 114 (and fixture 116), could be translated relative to the print head 132 and UV source 410. The UV source 410 can be fitted to both sides of the print head 132 to facilitate bi-directional printing of the mesh 112.

Figure 4E:
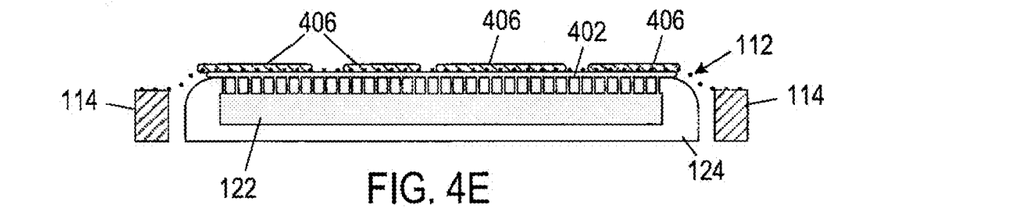

In FIG. 4E, the resulting stencil 406 is shown. The stencil 406 can typically be removed from the printer and used immediately without any further preparation or treatment. With thicker emulsion coverage (e.g. greater than 20% emulsion over mesh) post process curing may be used to complete curing of the stencil.

In some embodiments, a top surface of the top plate of the platen may be coated with a UV reflective material, such as a mirror, clear glass, or white polyethylene or another material to create reflection of the UV light upward to the emulsion coating the underside of mesh 112.

The process is called Direct to Mesh (DtM) to distinguish it from CtS (computer to screen), which requires additional processing both before (i.e., application of the emulsion) and after (washing off the unexposed emulsion and ink). In the DtM process, typically no additional processing is performed before and after application of the jettable emulsion, thus simplifying creation of the stencil 406.

Figure 5:
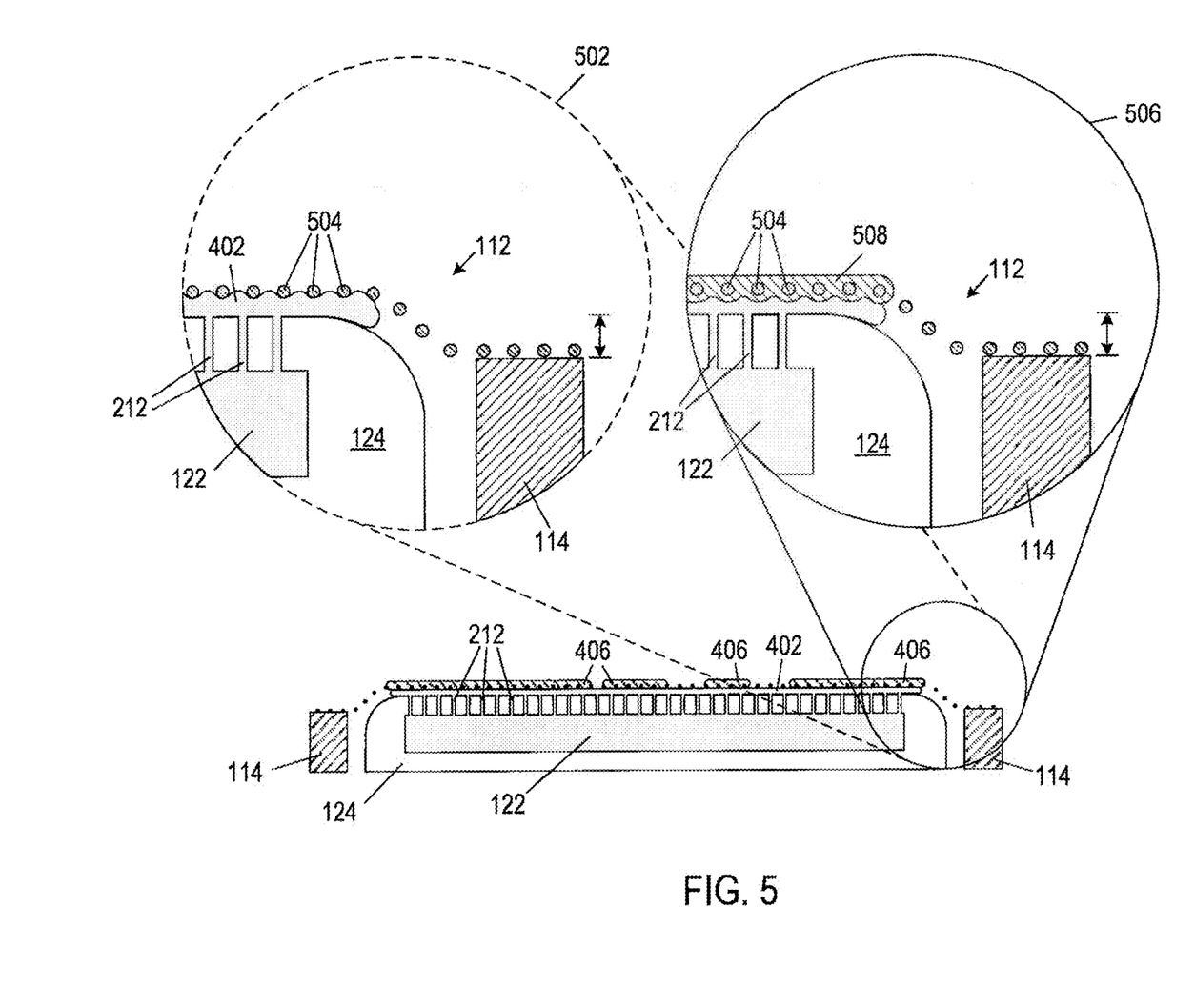
FIG. 5 shows a cross-sectional view of capillary behavior of a release fluid to aid with encapsulation of strands (or threads) of a mesh by the emulsion.

FIG. 5 shows a cross-sectional view of capillary behavior of the release fluid layer 402 to aid with encapsulation of the strands (or threads) of the mesh 112 by the emulsion. The release fluid 122 fills the cavities of the platen 124 and emerges through the holes 212 to form release fluid layer 402 on a top surface 124a of the platen 124. Magnified view 502 shows enlarged cross-sectional view of srands 504 of the mesh 112 and the release fluid layer 402 shown in FIG. 4C. The release fluid has a meniscus and exhibits capillary action that causes the release fluid to fill in spaces between strands of the mesh 112. The combination of meniscus and capillary action of the release fluid enables the release fluid to facilitate encapsulation of the strands 504 of the mesh 112 by the emulsion 508 during printing described above with reference to FIG. 4D. Magnified view 506 shows the strands 504 of the mesh 112 encapsulated by the emulsion 508 to form the stencil 406 shown in FIG. 4E.

Figure 6:
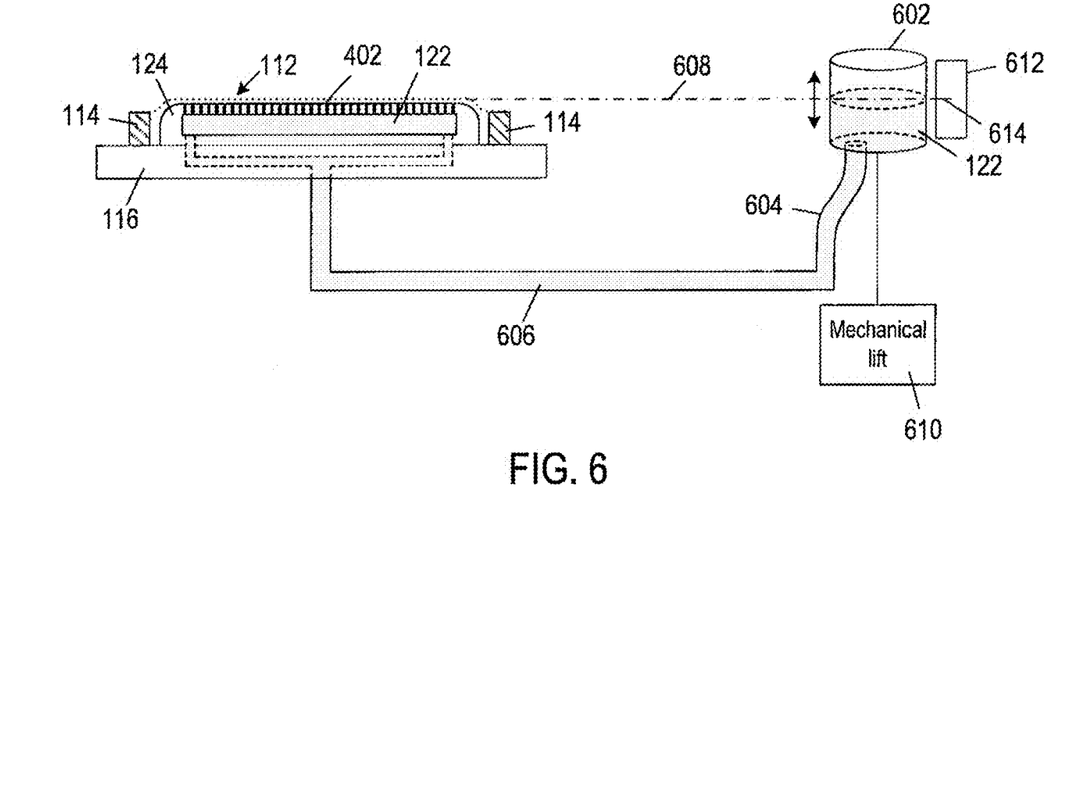
FIG. 6 shows a release fluid control system, according to an example of the present disclosure.
Figure 7:
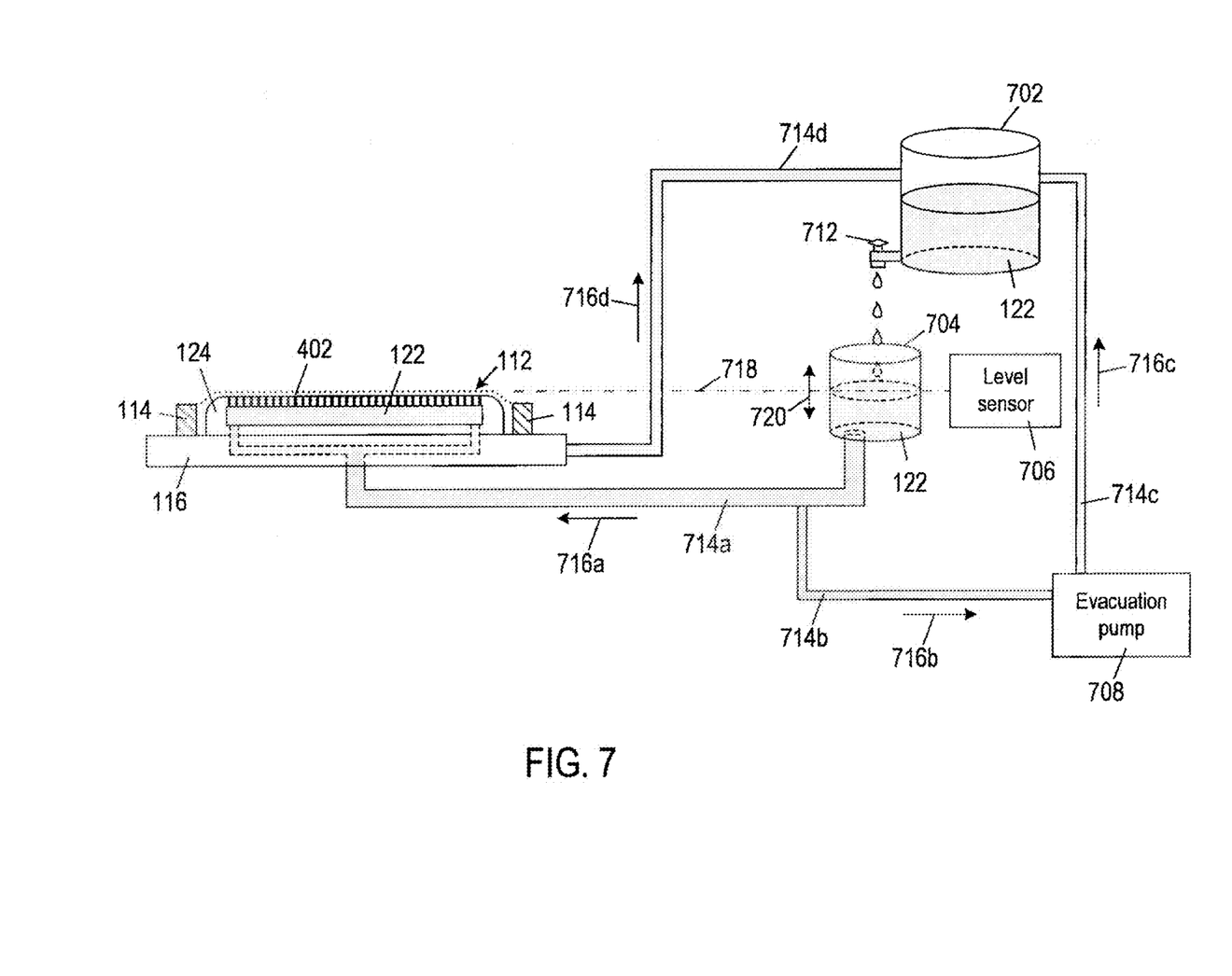
FIG. 7 shows a release fluid control system, according to an example of the present disclosure.
Figure 8:
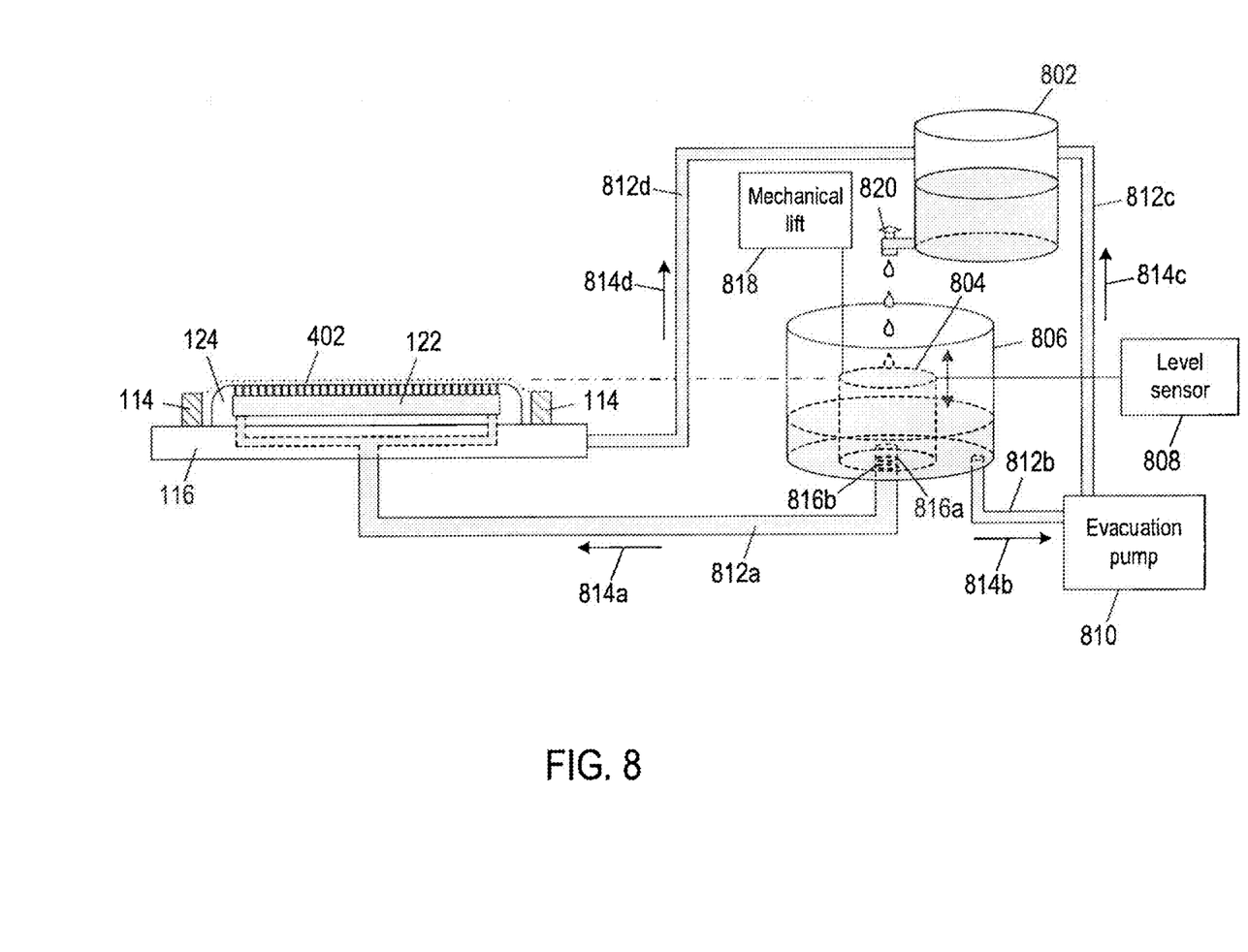
FIG. 8 shows a release fluid control system, according to an example of the present disclosure

Examples of release fluid control systems 126 are depicted in FIGS. 6, 7, and 8. The release fluid control systems are used to maintain the amount and level of the release fluid in the release fluid layer 402.

In FIG. 6, an example release fluid control system is connected to platen 124 and fixture 116. In this example, the release fluid control system includes a fluid level tank 602 and a fluid distribution system formed from a flexible hose 604 connected at one end to the base of the fluid level tank 602 and at the other end to a pipe or hose 606 that is in turn connected to the cavity 122 of the platen 124 (e.g., through the side or bottom of the platen 124 as described above with reference to FIG. 3). The fluid level tank 602, fluid distribution system, and cavity of the platen 124 contain the release fluid. The vertical position of the fluid level inlet tank 604 may be maintained and controlled with a mechanical lift 610. The mechanical lift 610 may be, for example, a ratchet jack or a screw jack. The level of the release fluid in the fluid level inlet tank 604 may be monitored with a measuring device 612, such as a linear encoder, that includes a mark 614 corresponding to a desired level of the release fluid layer 402 as represented by dot-dashed line 608. The mechanical lift 610 may be used to raise or lower the fluid level inlet tank 604. Atmospheric pressure and gravity are relied on to ensure that the amount of release fluid dispensed to form the release fluid layer 402 corresponds to the level, or height, of the release fluid in the fluid level inlet tank 602. The amount of release fluid in the release fluid layer 402 is controlled by raising or lowering the fluid level inlet tank 602. When the level of the release fluid in the fluid level inlet tank 604 is raised above the mark 614, such as by raising the fluid level inlet tank 604 using the mechanical lift 610, atmospheric pressure and gravity force additional release fluid into the release fluid layer 402. Alternatively, when the level of the release fluid in the fluid level inlet tank 604 is is lowered below the mark 614, such as by lowering the fluid level inlet tank 604 using the mechanical lift 610, atmospheric pressure and gravity force the release fluid back through the fluid distribution system to raise the level of the release fluid in the fluid level inlet tank 604, which decreases the amount of release fluid in the release fluid layer 402 or causes the release fluid layer 402 to disappear. Release fluid control system shown in FIG. 6 provides a position accuracy of less than about 1 mm, such as 0.8 mm.

In FIG. 7, an example release fluid control system is connected to platen 124 and fixture 116. In this example, the release fluid control system includes a release fluid reservoir 702, a fluid level inlet tank 704, a level sensor 706, and an evacuation pump 708. The release fluid reservoir 702 contains a volume of release fluid 122. The rate at which the release fluid fills the fluid level inlet tank 704 is controlled with a control valve 712. The release fluid control system also includes a fluid distribution system comprising a network of fluid connectors 714a-714d. The fluid connectors may be a combination of pumps, pipes and/or hoses. Directional arrows 716a-716d represent the directions the release fluid may flow within the network of fluid connectors. Connector 714a transmits release fluid from the fluid level tank 704 to cavities of the platen 124 (e.g., through the bottom or side of platen 124 as described above with reference to FIG. 3). Connector 714b carries release fluid from connector 714a to evacuation pump 708. Connector 714c carries release fluid from the evacuation pump 708 back to the release fluid reservoir 702. Connector 714d may be included to carry excess release fluid from the platen 124 back to the release fluid reservoir 702. Alternatively, the connector 714d may be omitted and the release fluid is allowed to drain away.

The fluid level inlet tank 704 is stationary. The level sensor 706 measures the level of the release fluid in the fluid level inlet tank 704 to ensure the level corresponds to a desired amount of release fluid in the release fluid layer 402. The level sensor 706 may be an ultrasonic sensor or an ultrasonic distance measuring sensor. The level sensor 706 may be accurate to within about 0.1 mm. The fluid volume metering at control valve 712 and evacuation pump 708 are used in combination to rapidly control changes to the level of the release fluid in the fluid level inlet tank 704 and corresponding changes in the amount of release fluid in the release fluid layer 402. Atmospheric pressure and gravity ensure that the amount of release fluid dispensed onto the top surface of platen 124 to form the release fluid layer 402 corresponds to the level of the release fluid in the fluid level inlet tank 704 as represented by dot-dashed line 718. For example, if the level of the release fluid in the fluid level inlet tank 704 is raised above the top surface of the platen 124 by, for example, adding more release fluid into the fluid level inlet tank 704, atmospheric pressure and gravity will force additional release fluid into the release fluid layer 402. Alternatively, if the level of the release fluid in the fluid level inlet tank 704 is lowered below the top surface of the platen 124 by, for example, using the evacuation pump 708, atmospheric pressure and gravity will force release fluid back through the connector 714a to raise the level of the release fluid in the fluid level inlet tank 704, which decreases the amount of release fluid in the release fluid layer 402 or causes the release fluid layer 402 to disappear.

In FIG. 8, an example release fluid control system is connected to a platen 124 and fixture 116 and is similar to the release fluid control system in FIG. 7. In this example, the release fluid control system includes a release fluid reservoir 802, a fluid level inlet tank 804 located within an overflow tank 806 (i.e., catch basin), a level sensor 808, and an evacuation pump 810. The release fluid control system also includes a fluid distribution system comprising a network of fluid connectors 812a-812d. The fluid connectors may be a combination of pumps, pipes and/or hoses. Directional arrows 814a-814d represent the directions the release fluid may flow within the network of fluid connectors. End of fluid connector 812a passes through an opening in the base of the overflow tank 806 and an opening in the base of the fluid level inlet tank 804. A sealing ring 816a is located between the opening in the fluid level inlet tank 804 and the connector 812a to prevent release fluid 122 from leaking into the overflow tank 806. A sealing ring 816b is located between the connector 812a and the opening in the overflow tank 806 to prevent the release fluid 122 from leaking out of the overflow tank 806. The end of connector 812a located within the fluid level inlet tank 804 may include openings or may be perforated to allow the free flow of release fluid. The fluid level inlet tank 804 may be raised or lowered using a mechanical lift 818, such as a linear encoder or a screw jack. The evacuation pump 810 is used to ensure that the level of the release fluid 122 in the overflow tank 806 is lower than the level of the release fluid 122 in the fluid level inlet tank 804 by pumping release fluid back to the release fluid reservoir 802. Release fluid 122 is added to the fluid level inlet tank 804 via control valve 820. Alternatively, the connector 812d may be omitted and the release fluid is allowed to drain away.

The level sensor 808 measures the position of the fluid level inlet tank 804 to ensure the level corresponds to a desired amount of release fluid in the release fluid layer 402. Unlike the release fluid control system in FIG. 7, the amount of release fluid in release fluid layer 402 is controlled by raising or lowering the fluid level inlet tank 804 such that any excess fluid overflows the sides of the fluid level inlet tank 804 in the overflow tank 806. When the fluid level inlet tank 804 is raised so that the level of the release fluid is above the level of the top surface of the platen 124, atmospheric pressure and gravity force release fluid into the release fluid layer 402. Alternatively, when the fluid level inlet tank 804 is lowered so that the level of the release fluid in the fluid level inlet tank 804 is below the level of the top surface of the platen 124, atmospheric pressure and gravity force the release fluid back through fluid distribution system to raise the level of the release fluid in the fluid level inlet tank 804, which decreases the amount of release fluid in the release fluid layer 402 or causes the release fluid layer 402 to disappear.

The level sensor 808 and the mechanical lift 818 may be connected to a computer system (not shown) that receives a feedback signal from level sensor 808 regarding the level of the fluid level inlet tank 804. The computer system may electronically control the mechanical lift 818 to raise or lower the fluid level inlet tank 804.

Note that the release fluid control system shown in FIG. 7 relies on high precision and accuracy in controlling the level of the release fluid in the fluid level inlet tank 804 to maintain the Level of the release fluid layer 402. By contrast, the release fluid control system shown in FIG. 8 relies on high precision and accuracy in positioning the fluid level inlet tank 804 to maintain the level of the release fluid layer 402.

Figure 9:
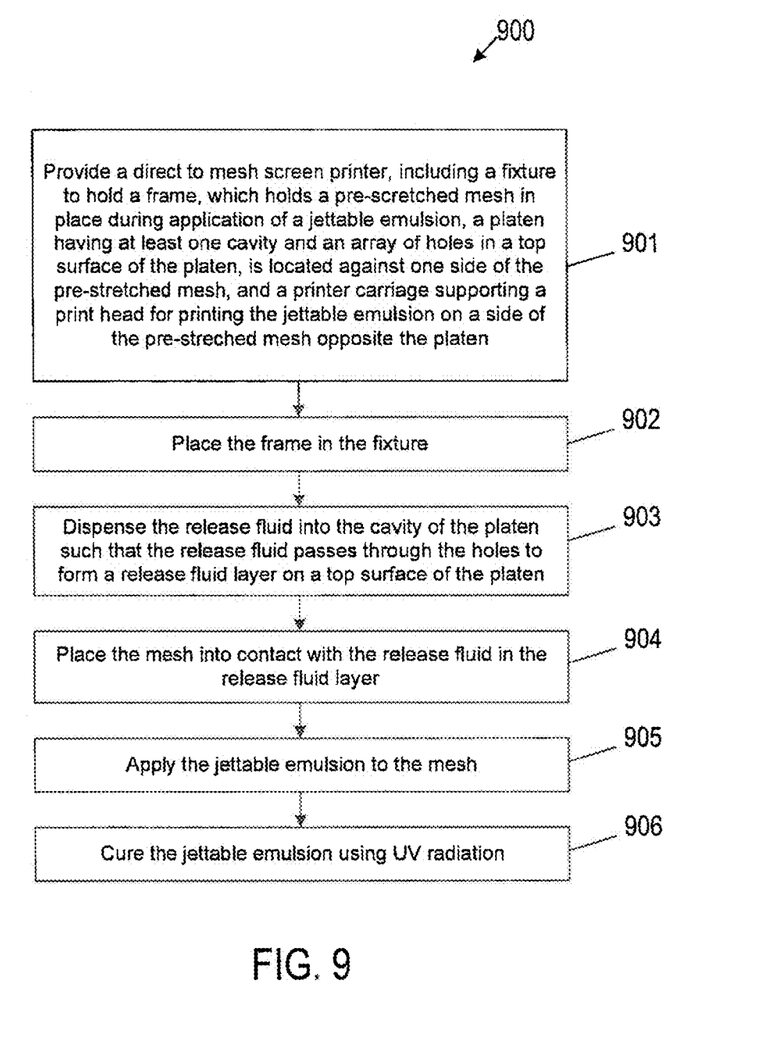
FIG. 9 is a flow chart illustrating a method of screen printing, according to an example of the present disclosure.

FIG. 9 depicts a flow chart of an example DtM process 900, in accordance with the disclosure herein, for preparing a stencil for screen printing. In the DtM process 900, the direct to mesh printer 100 is provided 901. As noted above, the DtM printer 100 includes the fixture 116 to hold the frame 114, the frame holds the pre-stretched mesh 112 in place during application of the jettable emulsion. The platen 124 of the DtM printer 100 has at least one cavity to hold the release fluid 122 and allow the release fluid to be dispensed through an array of holes in the top surface of platen 124 to form release fluid layer 402 against one side of the pre-stretched mesh 112. Finally, the DtM printer 100 includes the printer carriage 134 supporting the print head 132 for printing the jettable emulsion on the side of the pre-stretched mesh 112 opposite the platen 124.

The DtM process 900 continues with placing 902 the frame 114 in the fixture 116. The fixture 116 is part of the DtM printer 100 and is adapted to receive a wide variety of frame 114 sizes. The fixture 116 accurately holds the frame 114 in place, so that the printer carriage 134 is accurately registered to the mesh 112.

The DtM process 900 continues with dispensing 903 the release fluid 122 into the cavity of the platen 124 such that the release fluid passes through the holes in the perforate top surface of platen to form a release fluid layer 406 on the top surface. This may be important for very large stencils or very high dot density, such as 5,000 DPI, where the release fluid 122 might be consumed in the printing process or have time to evaporate even with a good emulsifier.

The DTM process 900 continues with placing 904 the mesh 112 into contact with the release fluid 122 in order to apply to the release fluid to the underside of the mesh 112. The top surface of the platen 124 is positioned even with or above the top surface of the frame. For example, the top surface of the platen 124 may exert little to no pressure on the mesh.

The DtM process 900 continues with applying 905 the jettable emulsion to the mesh 112 opposite the platen 124. As noted above, the jettable emulsion is applied relative to the mesh 112 by means of the inkjet printer 130, in which the inkjet print head 132 is to jet the jettable emulsion.

The DtM process 900 concludes with curing 906 the jettable emulsion using UV radiation. A UV light source may be used to cure the jettable emulsion, such as an LED or a halogen lamp.

At the conclusion of the DtM process 900, the stencil is formed and cured and is ready to be used to screen print colors onto an appropriate print surface, such as clothing, for example. In particular, the jettable emulsion after curing forms the screen stencil, in which openings in the screen stencil are to be used to print an image on the print surface.

EXAMPLES

Four series of examples were performed. In the Examples and Tables, the following definitions are now provided.

"Mesh Resolution" refers to the number of threads per centimeter (cm). The mesh resolution may include a letter to indicate the diameter of the thread, such as S (small diameter), T (medium diameter), or HD (heavy diameter). For example, "43 T" is a mesh having 43 threads per cm or 110 threads per inch, of medium diameter.

"Frame Type" indicates the type of frame 114 used, and may be a roller frame, aluminum, or a big roller frame. The "Aluminum" frame was a fixed square metal aluminum frame where the mesh was glued at a specific tension before starting. A typical value for the tension was about 26 Newtons (N). The "Roller Frame" was a retensionable frame, which allowed changing the tension of the mesh after the stencil was stretched. The roller frames are much more expensive than a standard square frame but are much easier to keep the tension correct and to re-stretch. The big roller frame was somewhat larger than the roller frame.

The metal mesh was a stainless steel, nickel-plated mesh. This type of mesh is frequently used for rotary screens or for screens that are exposed to aggressive fluids or long use (many prints/pressings) from the same stencil.

"Unit Resolution" is the dot density interweave (DPI) that is being jetted out of the printhead.

"Number of Pulses" refers to the number of firing pulses that are sent to an individual nozzle.

The print head used had 8 nozzle rows. The heading "Ink Channels" refers to how many rows were used to jet fluid. "All" means all 8 rows. The notation "11100111" indicates that the middle two rows were not fired; this gives the effect of a "gap" between the jetting.

"UV %" refers to the strength of the UV radiation emitted by the UV LED source 208, which was adjustable. The intensity of the UV LED source 208 was modulated with a PMW (Pulse Width Modulator) to control the intensity of the UV light generated. The maximum on the UV source 208 employed was 100 W/cm$^2$. A notation of 60%, for example, means that 60% of the UV light was modulated to 60% of full strength.

"Release Fluid" refers to the composition of the release fluid 122 that was applied to the platen 124.

"Background Type" refers to what was used on the surface of the platen 124. The platen 124 was kept at a constant height and then the "background" was placed on top of the platen. Examples of background types include a 4 mm mirror, 2 mm clear glass, 2× glass (two sheets of 2 mm clear glass), "Glass(up)/Mirror(down)" (2 mm clear glass on a 2 mm/4 mm mirror), and "Polyethylene White" (white polyethylene sheet).

"TEM" refers to Total Emulsion Measure and is a measure of the emulsion thickness. Often, a figure of EoM (Emulsion over Mesh) is used, but that is a ratio of emulsion thickness divided by mesh thickness. Here, the number in μm refers to overall thickness, including the thickness of the emulsion plus the thickness of the mesh.

"Smoothness" refers to the smoothness of the stencil. On the platen side, the surface should be extremely smooth to the touch, with no discernable roughness. On the print side, the surface should be smooth to the touch. Slight roughness (similar to what would be experienced with frosted glass) was considered to be "Acceptable". In the test results deemed "Not Acceptable", in general, the surface was like sandpaper.

The smoothness results are based on a subjective rating, where 1 is acceptable, 2 is marginally acceptable, 3 is marginally unacceptable, and 4 is unacceptable.

"Results" refers to a subjective rating of the overall results of the experiment. The same subjective rating scale described for smoothness is used here as well.

"A4 Print Time" refers to the time it took to print a screen having the dimensions of A4 media (21.0 cm×29.7 cm).

Example Series 1

In Example Series 1, six experiments were run; the details are provided in Tables IA (Test Parameters) and 1B (Results), below. All experiments used as the jettable emulsion UV Super Flex 100 ink, which is an experimental ink. The mesh color in each case was white. The frame type was variously a roller frame, aluminum or a big roller frame, as listed in Table IA. The unit resolution in each case was 1440 DPI. The printing speed in each case was 300 cm/sec. The number of pulses was as noted in Table IA. In the first four experiments, all eight ink channels were fired, while in the last two experiments, the middle two nozzle rows of the print head were not fired, leaving a gap. The UV in each case was 60% of full strength. The release fluid in all six experiments was 100% distilled water. The background type in the first three experiments was a 4 mm mirror, while in the last three experiments was 2 mm clear glass.

As seen in Table IB, the TQM ranged from 10 μm to 22 μm (Experiments 1, 4, 5, 6); no TQM was obtained for Experiments 2 and 3, resulting from the lack of sealed mesh. For Experiment 1, while the smoothness and results were acceptable, the mesh stuck to the mirror and the resulting TQM of 22 μm was deemed to be too high. Experiments 4, 5, and 6 resulted in acceptable smoothness and results and a sealed mesh.

It appears that the 2 mm clear glass gave better results than the 4 mm mirror and further that 2 pulses gave better results than 1 pulse. It is also noted that the frame used in Experiments 2 and 3 was aluminum.

TABLE IB

DIM Testing, Mesh = 43T, Unit Resolution = 1440 DPI - Results.

| Example | TEM | Smoothness | Results | Comments | A4 Print Time |
|---|---|---|---|---|---|
| 1-1 | 22 μm | 1 | 1 | Good line quality, TQM too high, mesh stuck to the mirror | 14 min |
| 1-2 | | 4 | 4 | No sealed mesh | 14 min |
| 1-3 | | 4 | 4 | No sealed mesh | 14 min |
| 1-4 | 13 μm | 1 | 1 | Sealed mesh | 14 min |
| 1-5 | 10 μm | 1 | 1 | Sealed mesh | 14 min |
| 1-6 | 10 μm | 1 | 1 | Sealed mesh | 14 min |

Example Series 2

In Example Series 2, twelve experiments were run: the details are provided in Tables IIA (Test Parameters) and IIB (Results), below. Ari experiments used as the jettable emulsion UV Super Flex 100 ink. The mesh color in each case was yellow. The frame type in each case was aluminum. The unit resolution in each case was 1080 DPI. The printing speed was 375 cm/sec. The number of pulses was as noted in Table II. In all experiments, all eight ink channels were fired. The UV was 60% of full strength for ail experiments, except Experiment 11, where the UV was 40% of full strength. The release fluid 122 was as noted in Table IIA. The background type was a noted in Table IIA.

As seen in Table IIB, the TQM ranged from 7 μm to 20 μm; no TQM was obtained for Experiment 5. For Experiments 1-4, 6, and 12, the smoothness and results were acceptable. For Experiments 7 and 8, the smoothness and results were marginally acceptable. For Experiments 5, 9, 10, and 11, neither the smoothness nor the results were acceptable; as indicated in Table II, these experiments resulted in mesh sticking to the print surface on the platen.

The only difference between Experiments 4 and 5 was the background type used, 2×glass up vs. polyethylene. It appears that the former yields better results than the latter.

The only difference between Experiments 4 and 7-8 was the background type used, 2×glass up vs. 4 mm glass up. It appears that the former yields better results than the latter.

With regard to Experiments 9, 10, and 11, these were the only experiments to use a liquid comprising 95% distilled water and 5% ANODAL ASL (Gedacolor). Other liquids, e.g., 100% distilled water, 80% distilled water+20% Dead Sea salt, 80% distilled water+20% alcohol, and 50% dis-

TABLE IA

DIM Testing, Mesh = 43 T/110 tpi, Unit Resolution = 1440 DPI - Test Parameters.

| Example | Frame Type | Number of Pulses | Ink Channels | UV % | Release Fluid | Background Type |
|---|---|---|---|---|---|---|
| 1-1 | Roller Frame | 2 | all | 60% | 100% water | 4 mm mirror |
| 1-2 | Aluminum | 1 | all | 60% | 100% water | 4 mm mirror |
| 1-3 | Aluminum | 1 | all | 60% | 100% water | 4 mm mirror |
| 1-4 | Big Roller Frame | 2 | all | 60% | 100% water | 2 mm clear glass |
| 1-5 | Big Roller Frame | 2 | 11100111 | 60% | 100% water | 2 mm clear glass |
| 1-6 | Big Roller Frame | 2 | 11100111 | 60% | 100% water | 2 mm clear glass | tilled water+25% window cleaner+25% iso-propanol all gave acceptable or marginally acceptable smoothness and results.

TABLE IIA

DtM Testing, Mesh = 43T/110 tpi, Unit Resolution = 1080 DPI - Test Parameters.

| Example | Number of Pulses | Ink Channels | UV % | Release Fluid | Background Type |
|---|---|---|---|---|---|
| 2-1 | 3 | all | 60% | 100% water | 2× glass (up) |
| 2-2 | 3 | all | 60% | 80% water, 20% salt (Dead Sea) | 2× glass (up) |
| 2-3 | 3 | all | 60% | 80% water, 20% iso-propanol | 2× glass (up) |
| 2-4 | 3 | all | 60% | 50% water, 25% window cleaner, 25% iso-propanol | 2× glass (up) |
| 2-5 | 3 | all | 60% | 50% water, 25% window cleaner, 25% iso-propanol | polyethylene white |
| 2-6 | 3 | all | 60% | 50% water, 25% window cleaner, 25% iso-propanol | glass (up)/ mirror (down) |
| 2-7 | 3 | all | 60% | 50% water, 25% window cleaner, 25% iso-propanol | 4 mm glass (up) |
| 2-8 | 3 | all | 60% | 50% water, 25% window cleaner, 25% iso-propanol | 4 mm glass (up) |
| 2-9 | 3 | all | 60% | 95% water, 5% ANODAL ASL liquid (Gedacolor) | 4 mm mirror |
| 2-10 | 3 | all | 60% | 95% water, 5% ANODAL ASL liquid (Gedacolor) | 4 mm mirror |
| 2-11 | 3 | all | 40% | 95% water, 5% ANODAL ASL liquid (Gedacolor) | glass (up)/ mirror (down) |
| 2-12 | 3 | all | 60% | 80% water, 20% salt (Dead Sea) | glass (up)/ mirror (down) |

TABLE IIB

DIM Testing, Mesh = 43T, Unit Resolution = 1080 DPI - Results.

| Example | TEM | Smoothness | Results | Comments | A4 Print Time |
|---|---|---|---|---|---|
| 2-1 | 14 μm | 1 | 1 | | 10 min |
| 2-2 | 20 μm | 1 | 1 | | 10 min |
| 2-3 | 14 μm | 1 | 1 | | 10 min |
| 2-4 | 7 μm | 1 | 1 | | 10 min |
| 2-5 | | 4 | 4 | The mesh stuck to the polyester | 10 min |
| 2-6 | 7 μm | 1 | 1 | The line quality was very good | 10 min |
| 2-7 | 7 μm | 2 | 2 | The line quality was very good | 10 min |
| 2-8 | 7 μm | 2 | 2 | The line quality was very good | 10 min |
| 2-9 | 15 μm | 4 | 4 | The mesh stuck smoothly to the mirror | 10 min |
| 2-10 | 15 μm | 4 | 4 | The mesh stuck smoothly to the mirror | 10 min |
| 2-11 | 15 μm | 4 | 4 | The mesh stuck smoothly the mirror | 10 min |
| 2-12 | 7 μm | 1 | 1 | The line quality was very good | 10 min |

Example Series 3

In Example Series 3, five experiments were run; the details are provided in Tables IIIA (Test Parameters) and IIIB (Results), below. All experiments used as the jettable emulsion UV Super Flex 100 UV ink. The mesh color in each case was yellow. The frame type in each case was aluminum. The unit resolution in each case was either 1080 DPI or 1440 DPI The printing speed was either 300 cm/sec or 375 cm/sec, as noted in Table IIIA. The number of pulses was as noted in Table IIIA. In all experiments, the middle two nozzle rows of the print head were not fired, leaving a gap ("11100111"). The UV was 60% of full strength. The release fluid 122 in all six experiments was 100% distilled water. The background type in all experiments was a 4 mm mirror.

As seen in Table IIIB, the TQM ranged from 3 μm to 45 μm. For all experiments the smoothness was acceptable, while for Experiments 3, 4, and 5, the results were acceptable. For Experiments 1 and 2, the results were marginally not acceptable, due to slight sticking of the mesh.

In Experiments 1 and 2, the number of pulses was the same for both (2), while for Experiments 3, 4, and 5, the number of pulses was different (1). It appears that this difference caused Experiments 1 and 2 to have marginally non-acceptable results.

TABLE IIIA

DtM Testing, Mesh = 120T, 43T - Test Parameters.

| Example | Mesh Resolution | Unit Resolution | Speed, cm/sec | Number of Pulses | Background Type |
|---|---|---|---|---|---|
| 3-1 | 120T | 1080 DPI | 375 | 2 | 4 mm mirror |
| 3-2 | 120T | 1440 DPI | 300 | 2 | 4 mm mirror |
| 3-3 | 43T | 1080 DPI | 375 | 1 | 4 mm mirror |
| 3-4 | 43T | 1440 DPI | 300 | 1 | 4 mm mirror |
| 3-5 | 43T | 1440 DPI | 300 | 1 | 4 mm mirror |

TABLE IIIB

DIM Testing, Mesh = 120T, 43T - Results.

| Example | TEM | Smoothness | Results | Comments | A4 Print Time |
|---|---|---|---|---|---|
| 3-1 | 14 μm | 1 | 3 | The mesh stuck slightly | 10 min |
| 3-2 | 45 μm | 1 | 3 | The mesh stuck slightly | 14 min |
| 3-3 | 3 μm | 1 | 1 | | 10 min |
| 3-4 | 7 μm | 1 | 1 | | 14 min |
| 3-5 | 7 μm | 1 | 1 | | 20 min |

Based on the foregoing Examples, it appears that the results may be influenced or impacted by some very complex interactions of fluids (both the emulsion and any release fluid); platen composition (e.g. single glass, dual glass, glass plus mirror, etc.); curing strength (20% to 100% UV); dot density (1080, 1440); the number of pulses; etc. From an analytic viewpoint, it appears that the combinations are almost infinite. Currently, the only method for evaluation of a set of parameters is pragmatic; i.e., each set must be tested, based on the teachings herein. However, such testing is not considered to be undue.

Advantages of the DtM process include the complete elimination of both stencil preparation and post-processing as follows:

Machines such as emulsion applicators, dryers, separate exposure units are not needed. Alternatively, when the TQM is high there may be cause to perform separate exposes.

A perforated platen is used to introduce a release fluid below and in contact with the mesh. The perforated top surface of the platen ensures that the mesh is evenly coating by the release fluid, controls penetration of the release fluid into the mesh, and maintains a constant release fluid moisture level of the mesh throughout printing of the emulsion onto the mesh.

Note that the experiments described above were performed using a platen without a perforated top surface and with a perforated surface described above. Although the platens produced similar results, the platen with a perforated top surface outperformed the non-perforated platen for use in high resolution stencil printing by ensuring a uniformly wetted mesh during printing. By contrast, the platen with the non-perforated top surface created challenges with trying to maintain a mesh wet.

Most of the chemicals (all except degreasers) and greater than 80% of the water usage are eliminated.

All of the processing can be done without having special low UV light rooms. Indeed, the DtM process can be carried out in normal factory/office lighting or daylight. The jettable emulsion is retained inside a UV-protected cartridge or bag when handling. It is only exposed to daylight or UV light when it is jetted onto the mesh 112.

Because the process disclosed herein can use conventional, less expensive mesh 112, it can often be more efficient and cheaper to strip and reapply the mesh to the frame 114 rather than washing the mesh, which entails water and chemicals and a special cleaning station. Note: it is also not necessary to use a colored mesh (yellow) which are more expensive than a white mesh and used in the conventional process to reduce UV reflections The raw, unprocessed screen, or mesh 112 is placed on the DtM printer 100 and a fully prepared, ready to use stencil is removed from the DtM printer 100 once the process is complete that can be placed directly onto a carousel for printing an image onto a print surface.

Further advantages of the DtM process 900 are that each stencil is very accurately registered on the mesh 112 so that it is possible to skip micro-registration when mounting on the carousel. With the DtM process 900, because each stencil is accurately positioned on the frame 114 (both absolute and relative), then no adjustments are necessary or required. This is accomplished through the use of the fixture 116. The stencil frame typically has registration holes or point affixed to it. Each different carousel manufacturer has their own registration system. The frame fixture 116 is equipped with the same registration system (or possibly an auxiliary registration system of another design). The frame fixture 116 permits the precise alignment of the stencil frame 114. To accomplish this, a test print is done with the 4 (or 6 or more) colors, then the carousel is fine-tuned. As long as no changes to the carousel are made (or the carousel does not get out of alignment) and all stencils are created on the same printer, then the stencils will be precisely aligned.

It will be appreciated that the DtM process 900 disclosed herein has significant reductions in either or both process time and complexity, labor, and capital equipment (including specialized lighting facilities), as well as significant reductions of process chemicals and water.

The DtM process 900 described above can also be used for rotary screen printing. Rotary screen printing is used in labelling and other somewhat narrow but frequently repeated printing processes (wall papers, linear linoleum, etc.). Rotary screen printing is extremely fast for these applications, where each of the four colors (and any spot colors) are placed on cylinders and the material passes underneath. Rotary screen printing typically uses stainless steel mesh 112 for durability and stability.

Today, many rotary stencils are made by large service bureaus (there are about three in Europe). Each stencil can cost over 100 €uros and the yearly cost of stencil replacement can run several hundred thousand €uros. This does not even take into account the inconvenience of using the service bureau. Many companies would be able to recoup the cost of a machine in a couple of quarters while reducing their dependence on expensive service bureaus.

It is appreciated that, in the foregoing description, numerous specific details are set forth to provide a thorough understanding of the examples. However, it is appreciated that the examples may be practiced without limitation to these specific details. In other instances, well-known methods and structures may not be described in detail to avoid unnecessarily obscuring the description of the examples. Also, the examples may be used in combination with each other.

While a limited number of examples have been disclosed, it should be understood that there are numerous modifications and variations therefrom. For example, the "orientation" of the printer bed/table may be changed from horizontal to vertical, due to new high/ultra-high velocity print head technologies that may permit jetting onto a vertical surface.

What is claimed is:

1. A direct to mesh screen printer for creating a screen stencil, including:
   a frame to hold a pre-stretched mesh in place during application of a jettable emulsion;
   a fixture to hold the frame;
   a platen having a cavity and perforated top surface, the cavity holds a release fluid dispensed through holes in the top surface and form a release fluid layer against one side of the pre-stretched mesh;
   a release fluid control system for dispensing the release fluid into the cavity of the platen and form the release fluid layer; and
   a printer carriage supporting a print head for printing the jettable emulsion on a side of the pre-stretched mesh opposite the platen.

2. The direct to mesh screen printer of claim 1, wherein the fixture securely and firmly holds the frame with the pre-stretched mesh in place during application of the jettable emulsion.

3. The direct to mesh screen printer of claim 1, wherein the platen has at least one input port to receive the release fluid and at least one output port to dispense with release fluid into the cavity.

4. The direct to mesh screen printer of claim 1, wherein the holes in the perforated surface of the platen extend to the cavity.

5. The direct to mesh screen printer of claim 1, wherein the release fluid control system includes:
release fluid reservoir with a control valve;
a fluid level inlet tank that receives the release fluid from the release fluid reservoir and is connected by a fluid connector to the cavity of the platen;
a level sensor positioned to monitor level of the release fluid within the fluid level inlet tank; and
an evacuation pump that pumps a portion of the release fluid that flows through the fluid connector to the release fluid reservoir, wherein an amount of release fluid in the release fluid layer is controlled to correspond to the level of release fluid in the fluid level inlet tank by operation of the control value and the evacuation pump.

6. The direct to mesh screen printer of claim 1, wherein the release fluid control system includes:
release fluid reservoir with a control valve;
a fluid level inlet tank that receives the release fluid from the release fluid reservoir and is connected by a fluid connector to the cavity of the platen;
a fluid level cylinder located within the fluid level inlet tank;
a level sensor positioned to monitor level of the release fluid within the fluid level inlet tank;
an overflow tank that holds the fluid level inlet tank and is connected by a fluid connector to the release fluid reservoir; and
a mechanical lift connected to the fluid level cylinder, wherein an amount of release fluid in the release fluid layer is controlled to correspond to the level of release fluid in the fluid level inlet tank by using the mechanical lift to raise or lower the fluid level cylinder.

7. The direct to mesh screen printer of claim 1, wherein the release fluid control system includes:
a fluid level inlet tank that holds the release fluid and is connected by a fluid connector to the cavity of the platen; and
a measuring device that identifies a desired level of the release fluid to obtain a desired amount of the release fluid in the release fluid layer, wherein an amount of release fluid in the release fluid layer is controlled by raising or lowering the fluid level inlet tank.

8. The direct to mesh screen printer of claim 1, wherein the release fluid is inhibits dot-gain while providing a smooth, non-reactive surface for the jettable emulsion after curing.

9. The direct to mesh screen printer of claim 1, wherein the release fluid comprises water and at least one emulsifier in a sufficient amount to prevent evaporation of the release fluid.

10. The direct to mesh screen printer of claim 1, wherein the jettable emulsion has a low viscosity of about 4 cP to about 15 cP and is both durable and flexible/elastic.

11. The direct to mesh screen printer of claim 8, wherein the jettable emulsion is a UV-activated acrylate monomer with elastomeric qualities after curing.

12. The direct to mesh screen printer of claim 1, further including a UV source for curing the jettable emulsion and forming a stencil for screen printing.

13. A process, including:
a direct to mesh screen printer, including a fixture to hold a frame, which holds a pre-stretched mesh in place during application of a jettable emulsion, a platen having a cavity and an array of holes in a top surface of the platen and is located against one side of the pre-stretched mesh, and a printer carriage supporting a print head for printing the jettable emulsion on a side of the pre-stretched mesh opposite the platen;
placing the frame in the fixture;
dispensing release fluid into the cavity of the platen such that the release fluid passes through the holes to form a release fluid layer on a top surface of the platen;
bringing the platen and the mesh together such that the release fluid in the release fluid layer wets an underside of the mesh;
printing the jettable emulsion on the mesh; and
curing the jettable emulsion using UV radiation.

14. The process of claim 13, wherein the jettable emulsion after curing forms a screen stencil, in which openings in the screen stencil are to be used to form an image on a surface.

15. The process of claim 13, wherein the release fluid inhibits dot-gain while not adhering to the jettable emulsion following its curing.

16. The process of claim 13, wherein the release fluid comprises water and at least one emulsifier in a sufficient amount to prevent evaporation of the release fluid.

17. The process of claim 13, wherein the jettable emulsion is a UV-activated acrylate monomer with elastomeric qualities after curing.

\* \* \* \* \*

UNITED STATES PATENT AND TRADEMARK OFFICE
CERTIFICATE OF CORRECTION

PATENT NO. : 12,134,263 B2
APPLICATION NO. : 18/021035
DATED : November 5, 2024
INVENTOR(S) : John Cecil Harwell, Shlomo Hermon and René Bär It is certified that error appears in the above-identified patent and that said Letters Patent is hereby corrected as shown below:

On the Title Page

Item (73), Change:
"(73) Assignee: DualChrome AG, Niederrohrdorf (CH)"
To:
--(73) Assignee: DuralChrome AG, Niederrohrdorf (CH)--

Signed and Sealed this
Tenth Day of December, 2024

Katherine Kelly Vidal
*Director of the United States Patent and Trademark Office*